(12) United States Patent
Lee et al.

(10) Patent No.: US 11,962,341 B2
(45) Date of Patent: Apr. 16, 2024

(54) ELECTRONIC DEVICE AND METHOD FOR WIRELESS COMMUNICATION

(71) Applicant: Samsung Electronics Co., Ltd., Suwon-si (KR)

(72) Inventors: Yousung Lee, Suwon-si (KR); Dongil Yang, Suwon-si (KR); Hyoseok Na, Suwon-si (KR); Doohwan Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 291 days.

(21) Appl. No.: 17/562,333

(22) Filed: Dec. 27, 2021

(65) Prior Publication Data

US 2022/0209810 A1 Jun. 30, 2022

Related U.S. Application Data

(63) Continuation of application No. PCT/KR2021/019729, filed on Dec. 23, 2021.

(30) Foreign Application Priority Data

Dec. 24, 2020 (KR) .................. 10-2020-0183745

(51) Int. Cl.
*H04B 1/44* (2006.01)
*H03F 3/24* (2006.01)

(52) U.S. Cl.
CPC ............... *H04B 1/44* (2013.01); *H03F 3/24* (2013.01); *H03F 2200/451* (2013.01)

(58) Field of Classification Search
CPC ........ H04B 1/44; H03F 3/24; H03F 2200/451
See application file for complete search history.

(56) References Cited

U.S. PATENT DOCUMENTS 10,256,848 B2 * 4/2019 Tanaka .................. H04B 1/005
10,790,870 B2 * 9/2020 Kang ..................... H04B 1/406
(Continued)

FOREIGN PATENT DOCUMENTS

CN 111130592 5/2020
JP 2020-202528 12/2020
(Continued)

OTHER PUBLICATIONS

Search Report and Written Opinion dated Mar. 30, 2022 in counterpart International Patent Application No. PCT/KR2021/019729.

*Primary Examiner* — Raymond S Dean
(74) *Attorney, Agent, or Firm* — Nixon & Vanderhye, P.C.

(57) ABSTRACT

The disclosure relates to an electronic device and a method for wireless communication including a power amplification circuit. According to an embodiment, an electronic device may include: a radio frequency processing module comprising radio frequency circuitry, a first power amplification circuit connected to the radio frequency processing module, a second power amplification circuit connected to the radio frequency processing module and the first power amplification circuit, and a front-end module comprising circuitry connected to the second power amplification circuit and an antenna and configured to transmit a signal, wherein the second power amplification circuit is configured to acquire, from the first power amplification circuit, a first signal obtained by amplifying a signal output from the radio frequency processing module and a second signal by amplifying a signal output from the radio frequency processing module.

15 Claims, 7 Drawing Sheets

(56) References Cited

U.S. PATENT DOCUMENTS

| | | | |
|---|---|---|---|
| 2015/0105120 A1 | 4/2015 | Lim | |
| 2016/0087656 A1 | 3/2016 | Park | |
| 2017/0265322 A1* | 9/2017 | Son | H01R 12/716 |
| 2018/0226932 A1 | 8/2018 | Beaudin et al. | |
| 2019/0090297 A1* | 3/2019 | Lan | H04W 72/20 |
| 2019/0229764 A1 | 7/2019 | Kang et al. | |
| 2019/0288389 A1* | 9/2019 | Bai | H01Q 1/50 |
| 2019/0288718 A1 | 9/2019 | Bai | |
| 2019/0334488 A1 | 10/2019 | Yoo et al. | |
| 2019/0364612 A1 | 11/2019 | Lan et al. | |
| 2020/0076452 A1 | 3/2020 | Dai | |
| 2020/0076565 A1 | 3/2020 | Lan et al. | |
| 2020/0204202 A1* | 6/2020 | Lee | H01Q 23/00 |
| 2020/0313714 A1 | 10/2020 | Ono | |
| 2020/0373961 A1 | 11/2020 | Kang et al. | |
| 2020/0395895 A1 | 12/2020 | Sano et al. | |

FOREIGN PATENT DOCUMENTS

| | | |
|---|---|---|
| KR | 10-2015-0043165 | 4/2015 |
| KR | 10-2016-0035842 | 4/2016 |
| KR | 10-2019-0124448 | 11/2019 |
| KR | 10-2020-0034551 | 3/2020 |
| KR | 10-2020-0087215 | 7/2020 |
| WO | 2020/145421 | 7/2020 |

* cited by examiner

ELECTRONIC DEVICE AND METHOD FOR WIRELESS COMMUNICATION

CROSS-REFERENCE TO RELATED APPLICATIONS

This application is a continuation of International Application No. PCT/KR2021/019729 designating the United States, filed on Dec. 23, 2021, in the Korean Intellectual Property Receiving Office and claiming priority to Korean Patent Application No. 10-2020-0183745, filed on Dec. 24, 2020, in the Korean Intellectual Property Office, the disclosures of which are incorporated by reference herein in their entireties.

BACKGROUND

Field

The disclosure relates to an electronic device and a method for wireless communication in a wireless communication system supporting different communication schemes.

Description of Related Art

With development of communication technology, a next-generation communication scheme such as a 5G communication scheme has been introduced to wireless communication, and a scheme (E-UTRAN new radio dual connectivity (ENDC)) which increases a data transmission rate by utilizing both schemes of a 4G (long-term evolution (LTE)) communication scheme and a 5G (new radio (NR)) communication scheme is being developed.

When a 4G (LTE) communication scheme and a 5G (NR) communication scheme use the same frequency band, the 5G (NR) communication scheme may have a maximum of 100 MHz of a bandwidth (BW) wider than 20 MHz in the 4G (LTE), and cyclic-prefix orthogonal frequency division multiplexing (CP-OFDM) is also used for TX communication, and thus, PARP increases compared to DFS-s-OFDM which has been used in the 4G (LTE). When the 5G (NR) communication scheme is to be supported to secure linearity, a power amplification circuit used in the 4G (LTE) communication scheme cannot be used, and a separate power amplification circuit supportable in the 5G (NR) communication scheme can be used.

When a separate power amplification circuit (PA) in a scheme (LTE+NR ENDC) supporting both communication schemes of the 4G (LTE) communication scheme and the 5G (NR) communication scheme is implemented, a case in which each power amplification circuit is to support the same frequency band may occur as the number of combinations of frequency bands in the ENDC scheme increases. In this case, to connect an output terminal of each power amplification circuit and a front-end module (FEM) of a wireless communication module, a switch (single-pole double-throw (SPDT) switch) is to be used in the back end of output of the power amplification circuit. Various services are provided through the 5G (NR) communication scheme and combinations of frequency bands in the ENDC scheme required by a business operator vary, and thus, use of the SPDT switch may increase for each frequency band according to the supported combination of frequency bands. Accordingly, when two PAs are used in an electronic device for wireless communication supporting the 4G (LTE) communication scheme and the 5G (NR) communication scheme, costs for implementing the used SPDT switch may increase and the size of a wireless communication circuit may increase.

SUMMARY

Embodiments of the disclosure provide an electronic device using a power amplification circuit configured for efficient wireless communication in a wireless communication system supporting different communication schemes, and a method for wireless communication in the same electronic device.

According to an embodiment of the disclosure, an electronic device may include: a radio frequency processing module comprising a radio frequency circuit, a first power amplification circuit connected to the radio frequency processing module, a second power amplification circuit connected to the radio frequency processing module and the first power amplification circuit, and a front-end module comprising circuit connected to the second power amplification circuit and an antenna and configured to transmit a signal, wherein the second power amplification circuit is configured to: acquire, from the first power amplification circuit, a first signal obtained by amplifying a signal output from the radio frequency processing module and a second signal obtained by amplifying a signal output from the radio frequency processing module based on a combination of frequency bands for a first communication scheme and a second communication scheme, and switch at least one of the first signal or the second signal to at least one output port connected to the front-end module based on a first frequency band of the first signal and a second frequency band of the second signal.

According to an embodiment, a method for wireless communication in an electronic device including a wireless communication module may include: amplifying a signal output from a radio frequency processing module of the wireless communication module by a first power amplification circuit of the wireless communication module based on a combination of frequency bands for a first communication scheme and a second communication scheme, acquiring, as a first signal, an amplification signal output from the first power amplification circuit, and a second signal obtained by amplifying a signal output from the radio frequency processing module based on the combination of the frequency bands, by a second power amplification circuit of the wireless communication module, and switching at least one of the first signal or the second signal to at least one output port connected to a front-end module of the wireless communication module, by the second power amplification circuit, based on a first frequency band of the first signal and a second frequency band of the second signal.

According to an embodiment, when separate power amplification circuits (PAs) in a scheme (LTE+NR ENDC) supporting both communication schemes of a 4G (LTE) communication scheme and a 5G (NR) communication scheme are implemented in an electronic device according to an electronic device and a method for wireless communication, an SPDP switch which has been configured at the back end connected to power amplification circuits may not be used, and thus, a cost of implementing a wireless communication module can be saved, and the size of the wireless communication module can be reduced so that a space mounted in the electronic device can be reduced, whereby more efficient wireless communication can be performed.

BRIEF DESCRIPTION OF THE DRAWINGS

The above and other aspects, features and advantages of certain embodiments of the present disclosure will be more apparent from the following detailed description, taken in conjunction with the accompanying drawings, in which.

With reference to description of drawings, the same or similar reference signs may be used for the same or similar elements.

DETAILED DESCRIPTION

Hereinafter, an electronic device according to various embodiments is described in greater detail with reference to accompanying drawings. The term "user" used in various embodiments may refer to a person using an electronic device or a device (for example, an artificial intelligence electronic device) using an electronic device.

Figure 1:
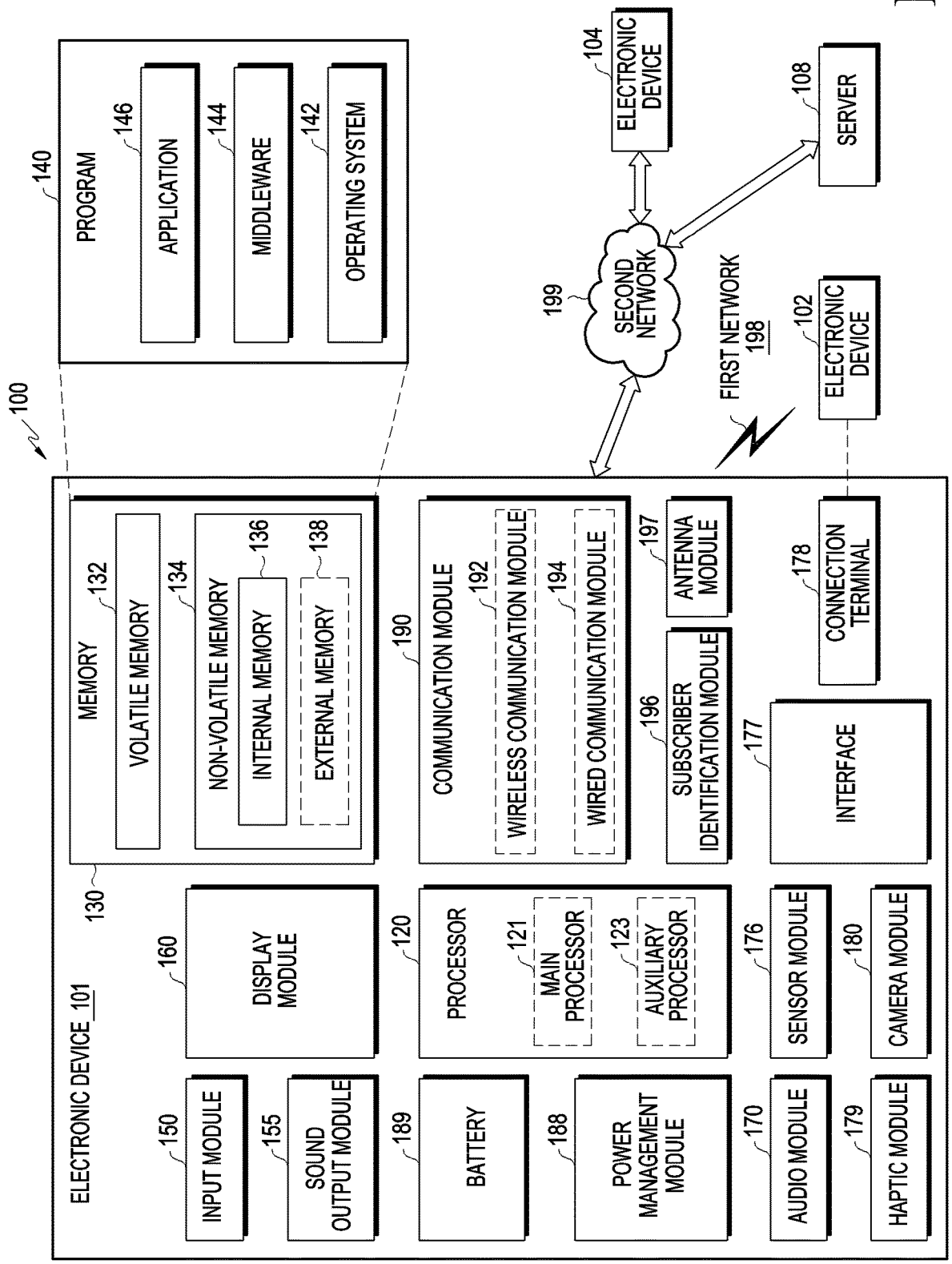
FIG. 1 is a block diagram illustrating an example electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing 1 eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
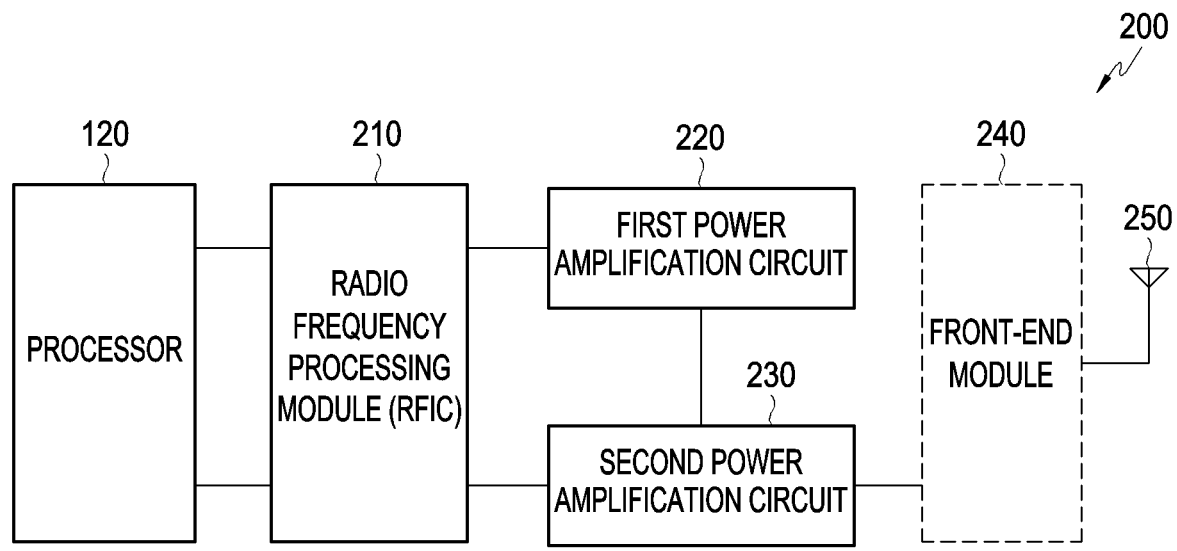
FIG. 2 is a block diagram illustrating an example configuration of a wireless communication module of an electronic device according to an embodiment.
Figure 3:
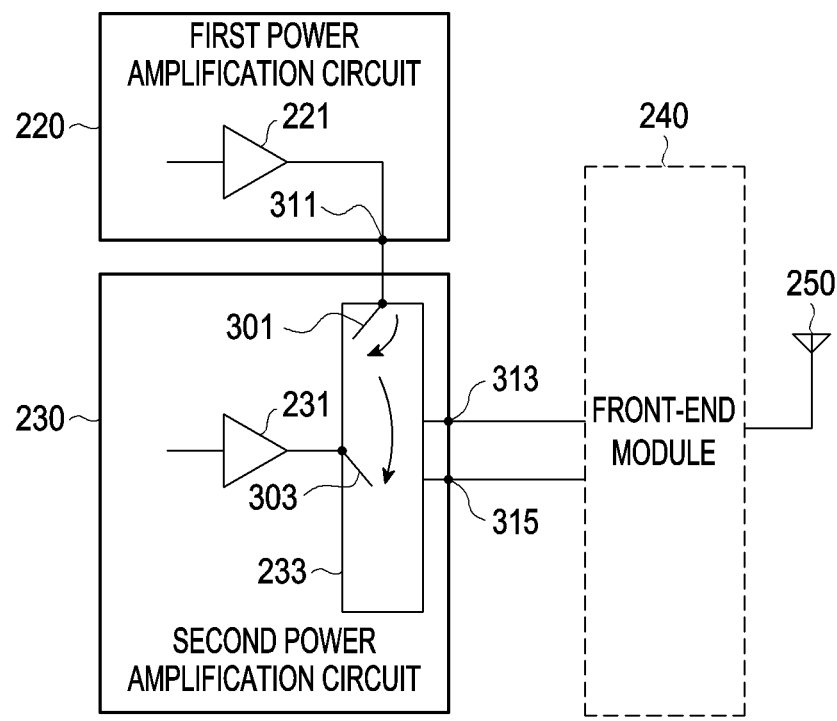
FIG. 3 is a block diagram illustrating an example configuration of a wireless communication module of an electronic device according to an embodiment.

FIG. 2 is a block diagram illustrating an example configuration of a wireless communication module of an electronic device according to an embodiment, and FIG. 3 is a block diagram illustrating an example configuration of a wireless communication module of an electronic device according to an embodiment.

Referring to FIGS. 2 and 3, according to an embodiment, an electronic device (e.g., the electronic device 101 of FIG. 1) may include a wireless communication module 200 (e.g., the wireless communication module 192 of FIG. 1) supporting a first communication scheme and a second communication scheme and processor (e.g., e.g., the processor 120 of FIG. 1 and including processing circuitry).

According to an embodiment, the wireless communication module 200 may include a radio frequency processing module (e.g., including a radio frequency integrated circuit (RFIC)) 210, a first power amplification circuit 220, a second power amplification circuit 230, a front-end module (e.g., front-end module with integrated duplexers ((L) FEMiD) 240, and/or an antenna 250. The wireless communication module 200 may include, but is not limited to, a device for processing a radio signal, and may further include elements for processing reception of a radio signal. The wireless communication module 200 may support both the first communication scheme and the second communications scheme to perform wireless communication in a scheme (e.g., an E-UTRAN new radio dual connectivity (ENDC) scheme) for increasing a data transmission rate, and may selectively perform first communication in the first communication scheme and second communication in the second communication scheme as necessary. For example, the first communication scheme may correspond to a 5G (e.g., NR) communication scheme, and the second communication scheme may correspond to a 4G (e.g., LTE) communication scheme. According to an embodiment, a frequency band of the first communication scheme may use a broader broadband and a higher frequency band, compared to a frequency band of the second communication scheme. A part (a part of a mid band) of the frequency band of the second communication scheme is used in the first communication scheme and two frequency bands may partially overlap, and thus two frequency bands may be configured to be selectively used.

According to an embodiment, the radio frequency processing module 210 may include a radio frequency integrated circuit (RFIC) and may correspond to an RF circuit for wireless communication, may perform signal processing for transmission/reception of a radio signal, and may be controlled by at least one processor (e.g., the processor 120 of FIG. 1) of the electronic device 101. The at least one processor (e.g., the processor 120 of FIG. 1) of the electronic device 101 may be connected to each of the first power amplification circuit 220 and the second power amplification circuit 230 to control operations of the first power amplification circuit 220 and the second power amplification circuit 230. The radio frequency processing module 210 may output a transmission signal to each of the first power amplification circuit 220 and the second power amplification circuit 230.

The radio frequency processing module 210 may process a frequency band which is to transmit a transmission signal, based on a combination of frequency bands of the first communication scheme and the second communication scheme. Each of the first power amplification circuit 220 and the second power amplification circuit 230 may include, for example, a multimode multiband (MMMB)-type power amplifier.

According to an embodiment, the processor may include various processing circuitry and control the same frequency band, as necessary, to use one of different frequency bands for first communication by the first communication scheme and the other for second communication by the second communication scheme, based on a combination of frequency bands for the first communication scheme and the second communication scheme (e.g., a E-UTRAN new radio dual connectivity (ENDC) type combination).

According to an embodiment, the first power amplification circuit 220 may be electrically connected to the radio frequency processing module 210 and the second power amplification circuit 230, and may include at least one power amplifier 221 which amplifies at least one signal output from the radio frequency processing module 210. According to an embodiment, the first power amplification circuit 220 may be configured to connect at least one input port to at least one output port of the radio frequency processing module 210 and connect at least one output port to the second power amplification circuit 230.

According to an embodiment, as shown in FIG. 3, the first power amplification circuit 220 may include at least one power amplifier 221 which amplifies at least one signal input from the radio frequency processing module 210. The first power amplification circuit 220 may be configured to output at least one amplified signal output from at least one first power amplifier 221, to the second power amplification circuit through at least one output port 311. The at least one output port 311 may be configured to be connected to an input terminal of a switch 233 included in the second power amplification circuit. For example, as shown in FIG. 3, the first power amplification circuit 220 may connect one output port to an input port of a first switch 301 included in a switch module 233 of the second power amplification circuit 230.

According to an embodiment, as shown in FIG. 3, the first power amplification circuit 220 may not include a switch electrically connected to an output terminal of the first power amplifier 221, and may be configured to connect an output port 311 to an input terminal of the switch module 233 of the second power amplification circuit 230 so that an amplified signal (e.g., a first signal) output from the first power amplifier 221 is input to the second power amplification circuit 230. For example, the first power amplification circuit 220 may support both the first communication scheme and the second communication scheme, and may support at least one of frequency bands (e.g., LB, MB, and HB).

According to an embodiment, the second power amplification circuit 230 may be configured to be electrically connected to the radio frequency processing module 210, the first power amplification circuit 220, and the front-end module 240. The second power amplification circuit 230 may acquire, from the first power amplification circuit 220, a first signal obtained by amplifying a signal output from the radio frequency processing module 210, and acquire a second signal by amplifying a signal output from the radio frequency processing module 210, based on a combination of frequency bands for the first communication scheme and the second communication scheme. The second power amplification circuit 230 may be configured to switch at least one of the first signal or the second signal to the at least one output port connected to the front-end module 240, based on the first frequency band of the first signal and the second frequency band of the first signal. The second power amplification circuit 230 may support the first communication scheme and/or the second communication scheme.

According to an embodiment, as shown in FIG. 3, the second power amplification circuit 230 may include the second power amplifier 231 which amplifies a signal input from the radio frequency processing module 210, and the switch module 233 connected to an output terminal of the second power amplifier 231 and an output terminal of the first power amplification circuit 220. The wireless communication module 200 may acquire the second signal by amplifying a signal input from the radio frequency processing module 210, using the second power amplifier 231.

According to an embodiment, the second power amplification circuit 230 may include the second power amplifier 231 or a third power amplifier (not shown) to amplify signals in two or more different frequency bands.

According to an embodiment, the switch module 233 may switch signals amplified from the first power amplifier 221 or the second power amplifier 231 to an output port (e.g., the output ports 311 and 315 of FIG. 3) of a frequency band corresponding to the switch module 233 and connect the same to the front-end module 240. The switch module 233 may be disposed in the form of a double-pole n throw (DPnT) switch including multiple switches 301 and 303.

According to an embodiment, the front-end module 240 may be configured to be connected to the second power amplification circuit 230 and the antenna 250. The front-end module 240 may transfer at least one signal output from the second power amplification circuit 230 to the antenna 250 to transmit the same through the antenna 250. The front-end module 240 may include a duplex (not shown) connected to the antenna 250. For example, the front-end module 240 may be configured to transmit at least one of the first signal or the second signal input through the at least one connected output port to the outside through the antenna 250.

According to an embodiment, the wireless communication module 200 of the electronic device 101 may include power supply modules (not shown) for supplying power to the first power amplification circuit 220 and the second power amplification circuit 230.

Referring to FIG. 3, according to an embodiment, each of the first power amplification circuit 220 and the second power amplification circuit 230 of the wireless communication module 200 may receive a signal to transmit, from the radio frequency processing module 210, based on a combination of frequency bands. For example, the combination of the frequency bands may be configured with a combination of any one of frequency bands (e.g., LB, MB, and HB) of the first communication scheme and any one of frequency bands (e.g., LB, MB, and HB) of the second communication scheme. For example, the combination of the frequency bands may be configured as shown in <Table 1> below, which corresponds to description as one example for convenience of description, and is not limited thereto and may be configured with another combination according to a business operator, a service, and the like. For example, in <Table 1> below, LB/MB ENDC may indicate a low band (e.g., supporting LTE ANCHOR) and a mid band (e.g., supporting NR SUB 6), and MB/HB ENDC may indicate a mid band (e.g., supporting LTE ANCHOR) and a high band (e.g., supporting NR SUB 6). NR MMMB #1 may indicate the first power amplification circuit 220, and NR MMMB #2 may indicate the second power amplification circuit 230.

TABLE 1

| LB/MB ENDC | | MB/HB ENDC |
| --- | --- | --- |
| NR MMMB #2: B28NR MMMB #1: N1 | | NR MMMB #2: B1 NR MMMB #1: N41 |
| LB/MB ENDC | | MB/HB ENDC |
| NR MMMB #2: B28NR MMMB #1: N3 | | NR MMMB #2: B3 NR MMMB #1: N41 |
| MB/LB ENDC | LB/HB ENDC | MB/HB ENDC |
| NR MMMB #2: B1 NR MMMB #1: N28 | NR MMMB #2: B28 NR MMMB #1: N41 | NR MMMB #2: B1 NR MMMB #1: N41 |

According to an embodiment, the first power amplification circuit 220 of the wireless communication module 200 may amplify a first signal received from the radio frequency processing module 210, through the first power amplifier 221, and input the amplified signal to the first switch 301 of the switch module 233 of the second power amplification circuit 230. The first power amplification circuit 220 may include at least one output port which outputs a signal in at a frequency band (e.g., at least one of an NR low band (LB), an NR mid band (MB), or an NR high band (HB)) of the first communication scheme. For example, the first power amplification circuit 220 may output the first signal from one of ports in frequency bands (NR low band (LB) and NR mid band (MB)) of the first communication scheme. For example, the first signal may be a signal in a frequency band (e.g., NR LB or NR MB) of the first communication scheme.

According to an embodiment, the second power amplification circuit 230 may amplify a second signal received from the radio frequency processing module 210, through the power amplifier 231, and may input the amplified second signal to the second switch 303 of the switch module 233. The second power amplification circuit 230 may support, for example, LMB ENDC (LB: LTE anchor, MB: NR sub 6). According to an embodiment, the first power amplification circuit 220 and the second power amplification circuit 230 support LTE/NR, and thus, the first power amplification circuit 220 may operate in LTE, and the second power amplification circuit 230 may operate in NR.

According to an embodiment, the switch module 233 of the second power amplification circuit 230 may switch the first switch 301 and the second switch 303 to connect the same to the first output port 313 and the second output port 315 connected to the front-end module 240, and may output the first signal and/or the second signal to the front-end module 240 through the first output port 313 and/or the second output port 315. For example, the second power amplification circuit 230 may switch the first switch 301, based on a frequency band (e.g., N1 (1920 to 1989 MHz)) of the input first signal, to output the first signal to the front-end module 240 through an output port (e.g., the output port 313 of FIG. 3) corresponding to the frequency band (e.g., N1 (1920 to 1989 MHz). For example, the second power amplification circuit 230 may switch the second switch 303, based on a frequency band (e.g., B3 (1710 to 1780 MHz)) of the input second signal, to output the second signal to the front-end module 240 through an output port (e.g., the output port 315 of FIG. 3) corresponding to the frequency band (e.g., B3 (1710 to 1780 MHz)). For example, when the frequency band of the first signal corresponds to a mid band (MB), and the frequency band of the second signal corresponds to a low band (LB), the second power amplification circuit 230 may output the first signal to the front-end module 240 through the first output port 313 using the first switch 301, and may output the second signal to the front-end module 240 through the second output port 315 using the second switch 303.

According to an embodiment, the front-end module 240 may transmit the first signal and the second signal simultaneously input through the first output port 311 and the second output port 313 of the second power amplification circuit 230, respectively, to the antenna 250. For example, when the frequency bands of the first signal and the second signal are identical, the front-end module 240 may selectively transmit the input first signal or second signal to the antenna 250.

Figure 4A:
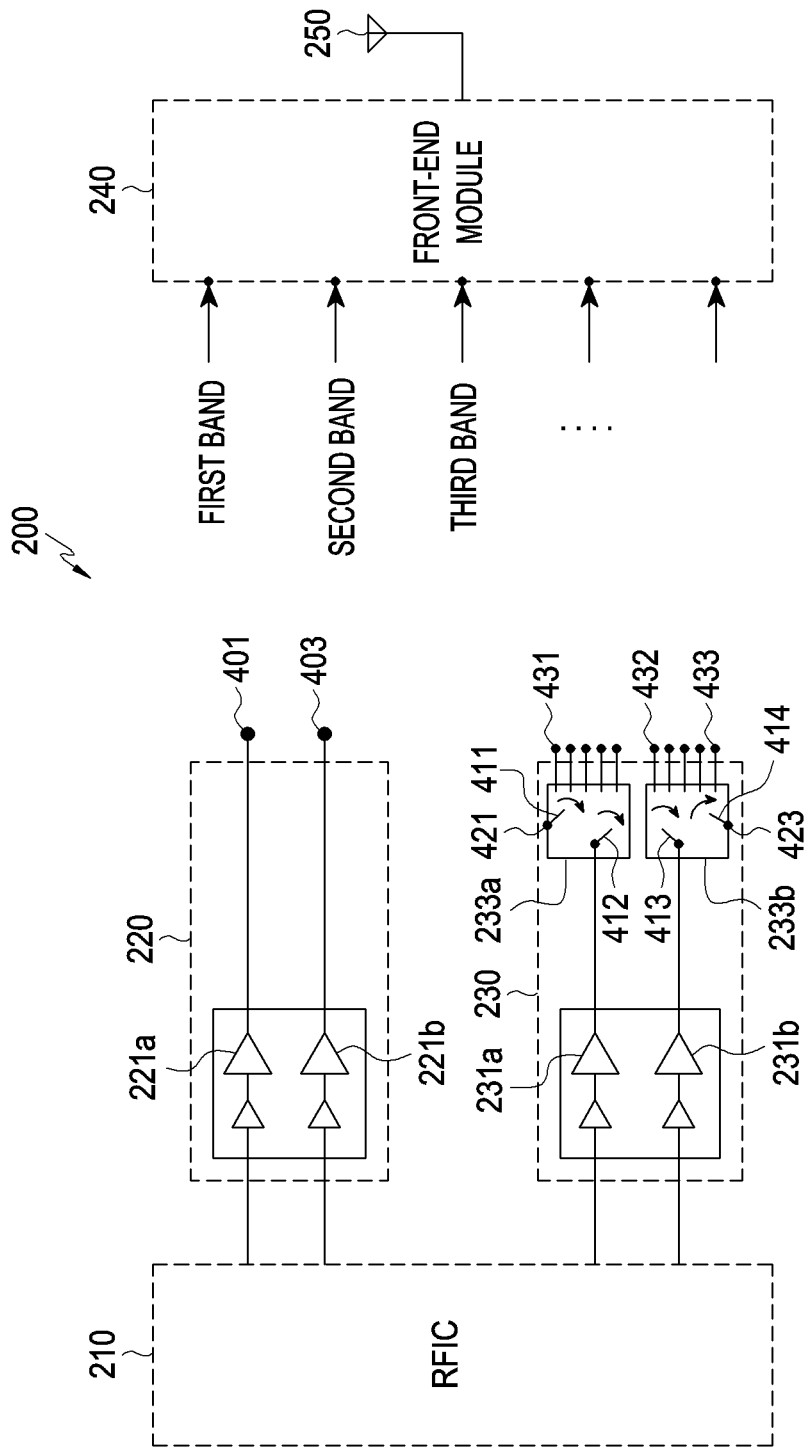
FIGS. 4A and 4B is a diagram illustrating an example configuration of a wireless communication module of an electronic device according to an embodiment.
Figure 4B:
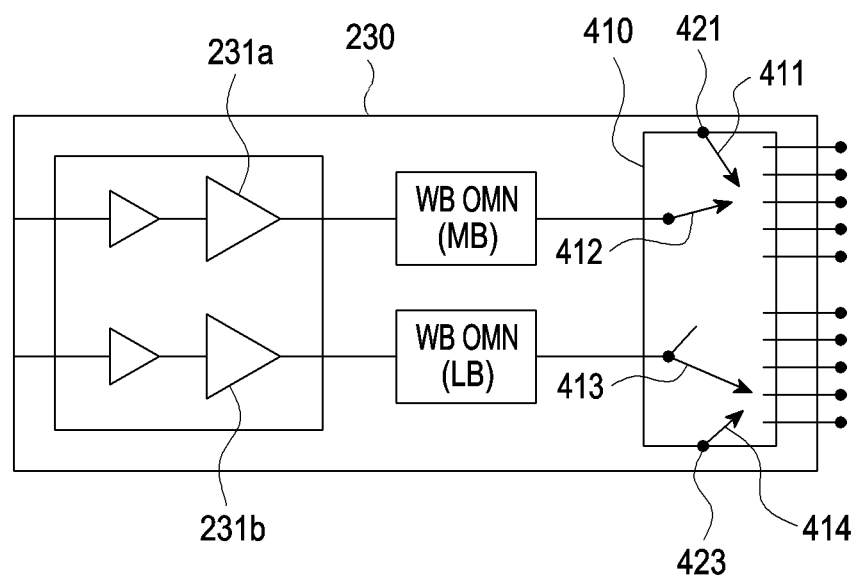

FIGS. 4A and 4B are diagrams illustrating example configurations of a wireless communication module of an electronic device according to an embodiment.

Referring to FIG. 4A, according to an embodiment, the first power amplification circuit 220 of the wireless communication module 200 may include input ports of two frequency bands (e.g., LB and MB) of a first communication scheme, the input ports being connected to the radio frequency processing module 210, and output ports 401 and 403 (e.g., an NR LB output port and an NR MB output port) of two frequency bands (e.g., LB and MB). The first power amplification circuit 220 may include power amplifier 221a and 221b for amplifying signals, respectively, the signal being received from the input ports of two frequency bands (e.g., LB and MB). The first power amplification circuit 220 may input a first signal (e.g., NR MB) and a third signal (e.g., NR LB) amplified by the power amplifiers 221a and 221b to input ports 421 and 423 of the switch modules 233a and 233b of the second power amplification circuit 230 through the output ports 401 and 403 of two frequency bands (e.g., LB and MB).

In an embodiment, the switch modules 233a and 233b may include a first switch module 233a and a second switch module 233b. The first switch module 233a may include a first switch 411 and a second switch 412. The second switch module 233b may include a third switch 413 and a fourth switch 414.

In an embodiment, the first power amplification circuit 220 may include a $(1-1)^{th}$ power amplifier 221a and a $(1-2)^{th}$ power amplifier 221b. For example, the $(1-1)^{th}$ power amplifier 221a may amplify a signal of a frequency band of the first signal. In another example, the $(1-2)^{th}$ power amplifier 221b may amplify a signal of a frequency band of the third signal. In an embodiment, the second power amplification circuit 230 may include a $(2-1)^{th}$ power amplifier 231a and a $(2-2)^{th}$ power amplifier 231b. For example, the $(2-1)^{th}$ power amplifier 231a may amplify a signal of a frequency band of the second signal. In another example, the $(2-2)^{th}$ power amplifier 231b may amplify a signal of a frequency band of the fourth signal.

According to an embodiment, the second power amplification circuit 230 may include input ports of two frequency bands (e.g., LB and MB) connected to the radio frequency processing module 210, the power amplifiers 231a and 231b, and/or switch modules 233a and 233b electrically connected to the power amplifiers 231a and 231b. The second power amplification circuit 230 may include multiple output ports which connect the switch modules 233a and 233b to the front-end module 240 by switching operation of the switch modules 233a and 233b. The power amplifiers 231a and 231b may amplify signals input from the input ports to output the amplified signals (e.g., the second signal and/or the fourth signal) to the switch modules 233a and 233b. As shown in FIG. 4A, the switch modules 233a and 233b of the second power amplification circuit 230 may be formed in the form of DPnT, but is not limited thereto, and may be formed, as shown in FIG. 4B, in the form of 4PNT SW, and the structure of the SW form may not be limited.

Referring to FIG. 4A, according to an embodiment, the second switch module 233b of the second power amplification circuit 230 may receive, from the radio frequency processing module 210, an input of the first signal (e.g., an NR MB signal) amplified through the first power amplification circuit 220, and an input of the second signal (e.g., an MB signal) output from the $(2\text{-}2)^{th}$ power amplifier 231b, based on a combination of frequency bands. The second switch module 233b may switch at least one of the first signal or the second signal to at least one output port connected to the front-end module 240, based on the first frequency band (e.g., NR MB) of the first communication scheme of the first signal and the second frequency band (e.g., MB) of the second communication scheme of the second signal. For example, when the first frequency band (e.g., NR MB) of the first communication scheme and the second frequency band (e.g., MB) of the second communication scheme correspond to a second band (e.g., N1) and a third band (e.g., B3) which are different from each other, the second switch module 233b may switch the fourth switch 414 to a second output port 432 corresponding to the second band (e.g., N1) to output the first signal to the front-end module 240 through the second output port 432, and may switch the third switch 413 to a third output port 433 corresponding to the third band (e.g., B3) to output the second signal to the front-end module 240 through the third output port 433. For example, when the first frequency band (e.g., NR MB) of the first communication scheme and the second frequency band (e.g., MB) of the second communication scheme correspond to the same third band (e.g., N3 and B3), the second switch module 233b may configure the fourth switch 414 to be switched on and the third switch 413 to be switched off, and may switch the fourth switch 414 to the third output port 433 corresponding to the third band to output the first signal. In another example, the second switch module 233b may configure the fourth switch 414 to be switched off and the third switch 413 to be switched on, and may switch the third switch 413 to the third output port 433 to output the second signal.

Referring to FIG. 4A, according to an embodiment, the first switch module 233a of the second power amplification circuit 230 may receive, from the radio frequency processing module 210, an input of a third signal (e.g., an NR LB signal) amplified through the first power amplification circuit 220 and an input of a fourth signal (e.g., an LB signal) output from the $(2\text{-}1)^{th}$ power amplifier 231a, based on a combination of frequency bands. The first switch module 233a may switch at least one of the third signal or the fourth signal to a corresponding output port connected to the front-end module 240, based on a third frequency band (e.g., NR LB) of the first communication scheme of the third signal and a fourth frequency band (e.g., LB) of the second communication scheme of the fourth signal. For example, when the third frequency band (e.g., NR LB) of the first communication scheme and the fourth frequency band (e.g., LB) of the second communication scheme correspond to the same first band (e.g., N28 and B28), the first switch module 233a may configure the first switch 411 to be switched on and the second switch 412 to be switched off, and may switch the first switch 411 to the first output port 431 corresponding to the first band to output the third signal. In another example, the first switch module 233a may configure the first switch 411 to be switched off and the second switch 412 to be switched on, and may switch the second switch 412 to the first output port 431 corresponding to the first band to output the fourth signal.

For example, when the third frequency band (e.g., NR LB) of the first communication scheme and the second frequency band (e.g., LB) of the second communication scheme correspond to a first band (e.g., N28) and a second band (e.g., B1) which are different from each other, the first switch module 233a may switch the first witch 411 to the first output port 431 corresponding to the first band (e.g., N28) to output the third signal to the front-end module 240, and may switch the second switch 412 to the second output port 432 corresponding to the second band (e.g., B1) to output the fourth signal to the front-end module 240.

Referring to FIG. 4B, according to an embodiment, the second power amplification circuit 230 may include a switch module 410 so that the switch module 410 includes 4PNT-type four switches 411, 412, 413, and 414. For example, when the frequency band combination corresponds to a B1+N28 ENDC combination, the first switch 411 connected to an output terminal of the first power amplification circuit 220 is switched on and the third switch 413 connected to an output terminal of the $(2\text{-}2)^{th}$ power amplifier 231b is switched on, and thus, the second power amplification circuit 230 may output the N28 first signal (e.g., an NR MB signal) and the B1 fourth signal (e.g., an LB signal). In another example, when the frequency band combination corresponds to a B28+N1 ENDC combination, the fourth switch 414 connected to an output port of the first power amplification circuit 220 is switched on and the second switch 412 connected to an output terminal of the $(2\text{-}1)^{th}$ power amplifier 231a is switched on, and thus, the second power amplification circuit 230 may output the B28 fourth signal (e.g., an LB signal) and the N1 fourth signal (e.g., an NR LB signal). As shown in FIG. 4B, the switch module 410 having a 4PNT switch structure does not need to use each of B1 SPDT SWITCH and B28 SPDT SW, and thus the size and a implementation cost of a wireless communication module of an electronic device can be reduced.

Figure 5:
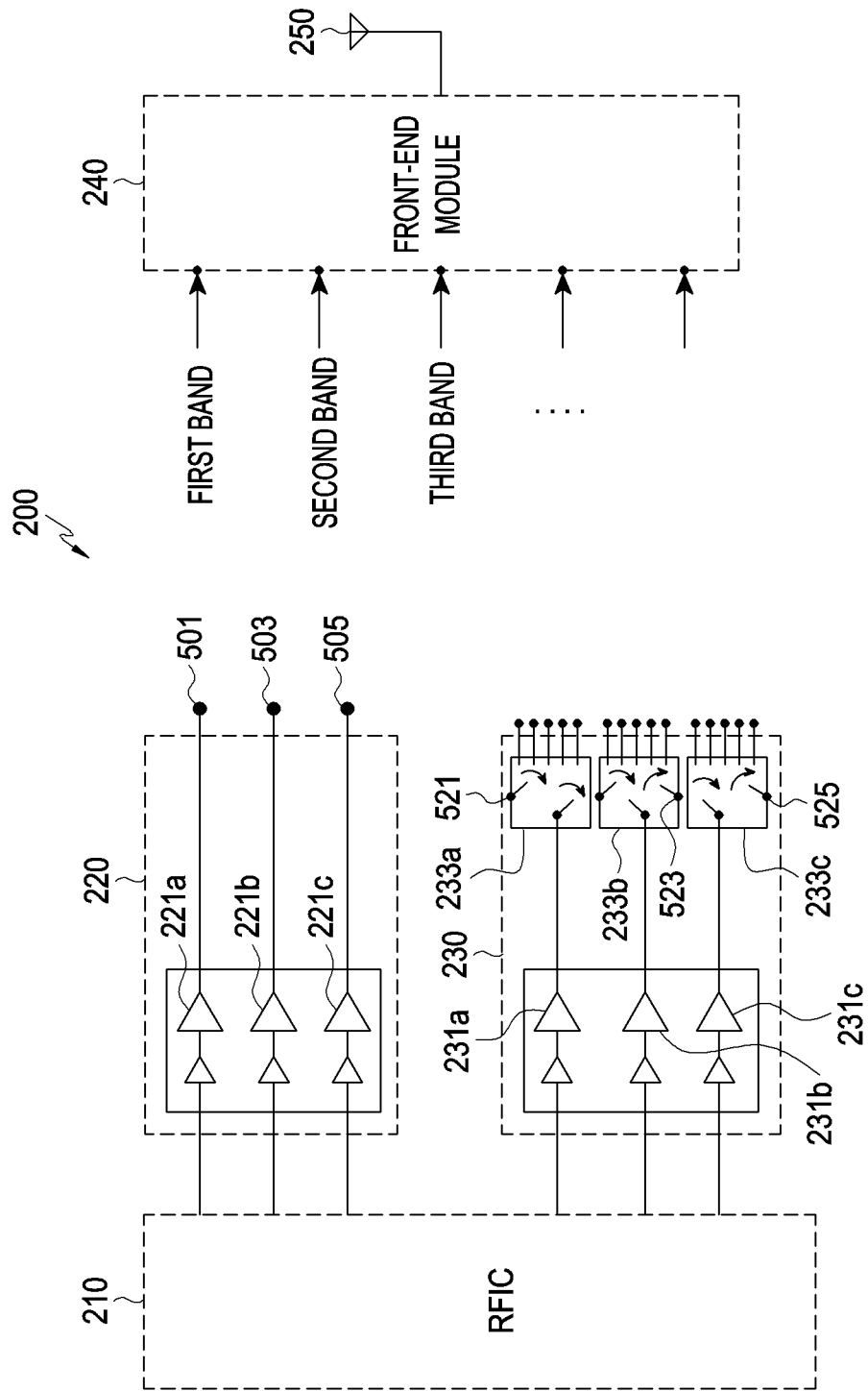
FIG. 5 is a diagram illustrating an example configuration of a wireless communication module of an electronic device according to an embodiment.

FIG. 5 is a diagram illustrating an example configuration of a wireless communication module of an electronic device according to an embodiment.

Referring to FIG. 5, according to an embodiment, the first power amplification circuit 220 of the wireless communication module 200 may include input ports of three frequency bands (e.g., LB, MB, and HB) of the first communication scheme, the input ports being connected to the radio frequency processing module 210, and output ports 501, 503, and 505 (e.g., NR LB, NR MB, and NR HB output ports) corresponding to three frequency bands (e.g., LB, MB, and HB). The first power amplification circuit 220 may include power amplifiers 221a, 221b, and 221c for amplifying signals (e.g., NR LB, NR MB, and NR HB signals), respectively, the signals being received from the input ports of three frequency bands (e.g., LB, MB, and HB). The first power amplification circuit 220 may input signals amplified by the power amplifiers 221a, 221b, and 221c to input ports 521, 523, and 525 (e.g., NR LB, NR MB, and NR HB input ports) of a second power amplification circuit 230 through the output ports 501, 503, and 505 (e.g., NR LB, NR MB, and NR HB output ports) of three frequency bands (e.g., LB, MN, and HB).

According to an embodiment, the first power amplification circuit 220 may include a $(1\text{-}1)^{th}$ power amplifier 221a, a $(1-2)^{th}$ power amplifier 221b, and a $(1-3)^{th}$ power amplifier 221c. In an embodiment, the second power amplification circuit 230 may include a $(2-1)^{th}$ power amplifier 231a, a $(2-2)^{th}$ power amplifier 231b, and a $(2-3)^{th}$ power amplifier 231c.

According to an embodiment, the second power amplification circuit 230 may include input ports of three frequency bands (LB, MB, and HB) of the first communication scheme, the input ports being connected to the radio frequency processing module 210, power amplifiers 231a, 231b and 231c for amplifying signals, respectively, the signals being received from three input ports, and/or switch modules 233a, 233b, and 233c connected to the power amplifiers 231a, 231b and 231c. The second power amplification circuit 230 may include multiple output ports which connect the switch modules 233a, 233b, and 233c to the front-end module 240 by switching operation of the switch modules 233a, 233b, and 233c.

According to an embodiment, the switch modules 233a, 233b, and 233c may include a first switch module 233a, a second switch module 233b, and a third switch module 233c. For example, the first switch module 233a may be electrically connected to the $(1-1)^{th}$ power amplifier 221a and the $(2-1)^{th}$ power amplifier 231a. In another example, the second switch module 233b may be electrically connected to the $(1-2)^{th}$ power amplifier 221b and the $(2-2)^{th}$ power amplifier 231b. In another example, the third switch module 233c may be electrically connected to the $(2-3)^{th}$ power amplifier 233c.

According to an embodiment, at least one of the first switch module 233a, the second switch module 233b, and/or the third switch module 233c may electrically connect the front-end module 240 to at least one of the $(1-1)^{th}$ power amplifier 221a, the $(1-2)^{th}$ power amplifier 221b, the $(1-3)^{th}$ power amplifier 221c, the $(2-1)^{th}$ power amplifier 231a, the $(2-2)^{th}$ power amplifier 231b, and the $(2-3)^{th}$ power amplifier 231c, based on a frequency band combination in the ENDC situation.

Figure 6:
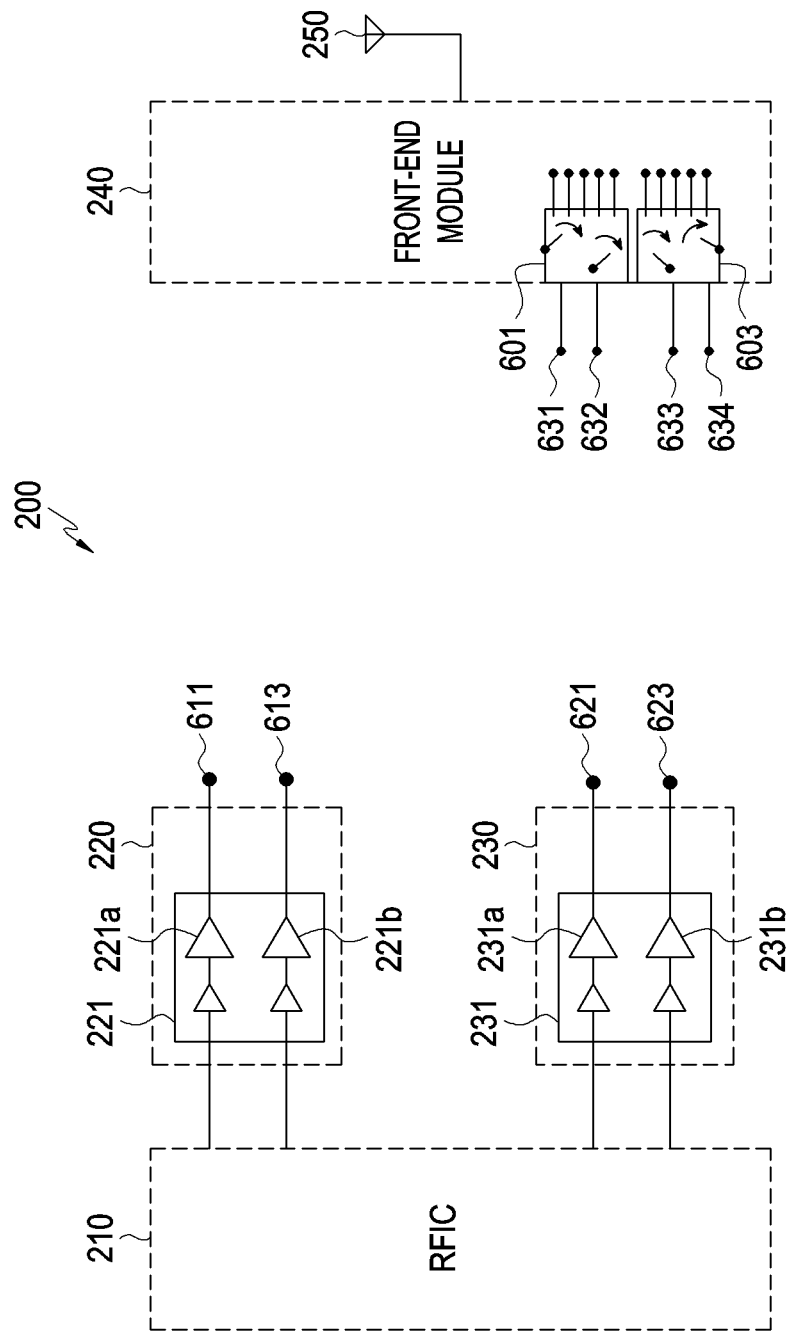
FIG. 6 is a diagram illustrating an example configuration of a wireless communication module of an electronic device according to an embodiment.

FIG. 6 is a diagram illustrating an example configuration of a wireless communication module of an electronic device according to an embodiment.

Referring to FIG. 6, according to an embodiment, all of the first power amplification circuit 220 and the second power amplification circuit 230 of the wireless communication module 200 may be configured not to include a switch, and an SW module for switching operation of each frequency band may be included in the front-end module 240. In an embodiment, the first power amplification circuit 220 may not include a switch module, and include power amplifiers 221a and 221b of two frequency bands (e.g., MB and LB) and output ports 611 and 613. In an embodiment, the second power amplification circuit 230 may not include a switch module, and include power amplifiers 231a and 231b of two frequency bands (e.g., MB and LB) and output ports 621 and 623. The front-end module 240 may include a first switch module 601 for receiving a first signal (LB) output from the first power amplification circuit 220 and a second signal (e.g., an LB signal) output from the second power amplification circuit 230 through the input ports 631 and 632 and switching the received first signal and second signal, and a second switch module 603 for receiving a third signal (e.g., an MB signal) output from the first power amplification circuit 220 and a fourth signal (e.g., an LB signal) output from the second power amplification circuit 230 through the input ports 633 and 634 and switching the received third signal and fourth signal. The front-end module 240 may transmit signals output from the first switch module 601 and the second switch module 603, through the antenna 250.

As shown in FIG. 6, output structures of the first power amplification circuit 220 and the second power amplification circuit 230 may be simple so as to use one port for each of the first frequency band (e.g., LB) and the second frequency band (e.g., MB), an SPDT switch for the same frequency band does not need to be used, and additionally, a line loss of a path of each of frequency bands between power amplification circuits 220 and 230 and the front-end module 240 can be reduced.

Accordingly, in an embodiment, main elements of an electronic device are described with reference to the electronic device 101 of FIGS. 1 and 2. However, in various embodiments, the elements illustrated in FIGS. 1 and 2 are not necessary, and more elements than the illustrated elements may be implemented by the electronic device 101, and fewer elements that the illustrated elements may be implemented by the electronic device 101. In addition, locations of the main elements of the electronic device 101 described above with reference to FIGS. 1 and 2 are changeable according to various embodiments.

According to an embodiment, an electronic device (e.g., the electronic device 101 of FIGS. 1 and 2) for electronic device wireless communication may include: a radio frequency processing module comprising radio frequency circuitry (e.g., the radio frequency processing module 210 of FIGS. 2, 4A, 4B, 5, and 6), a first power amplification circuit (e.g., the first power amplification circuit 220 of FIGS. 2, 3, 4A, 4B, 5, and 6) connected to the radio frequency processing module, a second power amplification circuit (e.g., the second power amplification circuit 230 of FIGS. 2, 3, 4A, 4B, 5, and 6) connected to the radio frequency processing module and the first power amplification circuit, and a front-end module (e.g., the front-end module 240 of FIGS. 2, 3, 4A, 4B, 5, and 6) comprising circuitry connected to the second power amplification circuit and an antenna and configured to transmit a signal, wherein the second power amplification circuit is configured to: acquire, from the first power amplification circuit, a first signal obtained by amplifying a signal output from the radio frequency processing module and a second signal obtained by amplifying a signal output from the radio frequency processing module, based on a combination of frequency bands for a first communication scheme and a second communication scheme, and switch at least one of the first signal or the second signal to at least one output port connected to the front-end module, based on a first frequency band of the first signal and a second frequency band of the second signal.

According to an embodiment, the front-end module may be configured to transmit at least one of the first signal or the second signal input through the connected at least one output port, in at least one of the first frequency band or the second frequency band through the antenna.

According to an embodiment, the first communication scheme may correspond to a 5G communication scheme, and the second communication scheme may correspond to a 4G communication scheme.

According to an embodiment, the first power amplification circuit may include at least one power amplifier (e.g., the power amplifiers 221 and 231 of FIG. 3, power amplifiers 221a, 221b, 223a, and 223b of FIGS. 4A, 4B, and 6, and the power amplifiers 221a, 221b, 221c, 223a, 223b, and 223c of FIG. 5) configured to amplify at least one signal input from the radio frequency processing module, and may be configured to output at least one signal output from the at least one power amplifier, to the second power amplification circuit through at least one output port connected to the second power amplification circuit, wherein the at least one amplified signal includes the first signal of the first communication scheme.

According to an embodiment, the second power amplification circuit may include at least one power amplifier configured to amplify at least one signal input from the radio frequency processing module, and a switch module (e.g., the switch module 233 of FIG. 3, the switch modules 233a and 233b of FIGS. 4A and 4B, and the switch modules 233a, 233b, and 233c of FIG. 5) comprising at least one switch configured to switch at least one signal output from the at least one power amplifier and at least one signal output from the first power amplifier. The switch module may include at least one switch (e.g., the switches 411 and 414 of FIGS. 4A and 4B) connected to at least one output port of the first power amplification circuit and at least one switch (e.g., the switches 412 and 413 of FIGS. 4A and 4B) connected to at least one amplifier of the second power amplification circuit, and the at least one amplified signal may include the second signal.

According to an embodiment, the switch module may be configured to switch the first signal to a first output port among the least one output port to transmit the first signal, and switch the second signal to a second output port among the at least one output port to transmit the second signal, wherein the first frequency band and the second frequency band may be different frequency bands.

According to an embodiment, the switch module may be configured to switch one of the first signal or the second signal to one of the at least one output port based on the first frequency band being identical to the second frequency band.

According to an embodiment, the front-end module may include a switch module (e.g., the first switch module 601 and the second switch module 602 of FIG. 6) comprising at least one switch configured to switch at least one signal output from at least one of the first power amplification circuit or the second power amplification circuit.

According to an embodiment, based on the first signal being input from at least one of the first power amplification circuit or the second power amplification circuit and the second signal being input from the second power amplification circuit, the switch module may be configured to switch the first signal to a first output port among output ports of the front-end module connected to the antenna, and switch the second signal to a second output port among the output ports of the front-end module, wherein the first frequency band may be different from the second frequency band.

According to an embodiment, the switch module may be configured to switch one of the first signal or the second signal to one of the output ports of the front-end module based on the first signal being input from at least one of the first power amplification circuit or the second power amplification circuit and the second signal being input from the second power amplification circuit, wherein the first frequency band may be identical to the second frequency band.

According to an embodiment, the electronic device may further include a processor (e.g., the processor 120 of FIGS. 1 and 2) electrically connected to the radio frequency processing module and configured to control operations of the first power amplification circuit and the second power amplification circuit.

Figure 7:
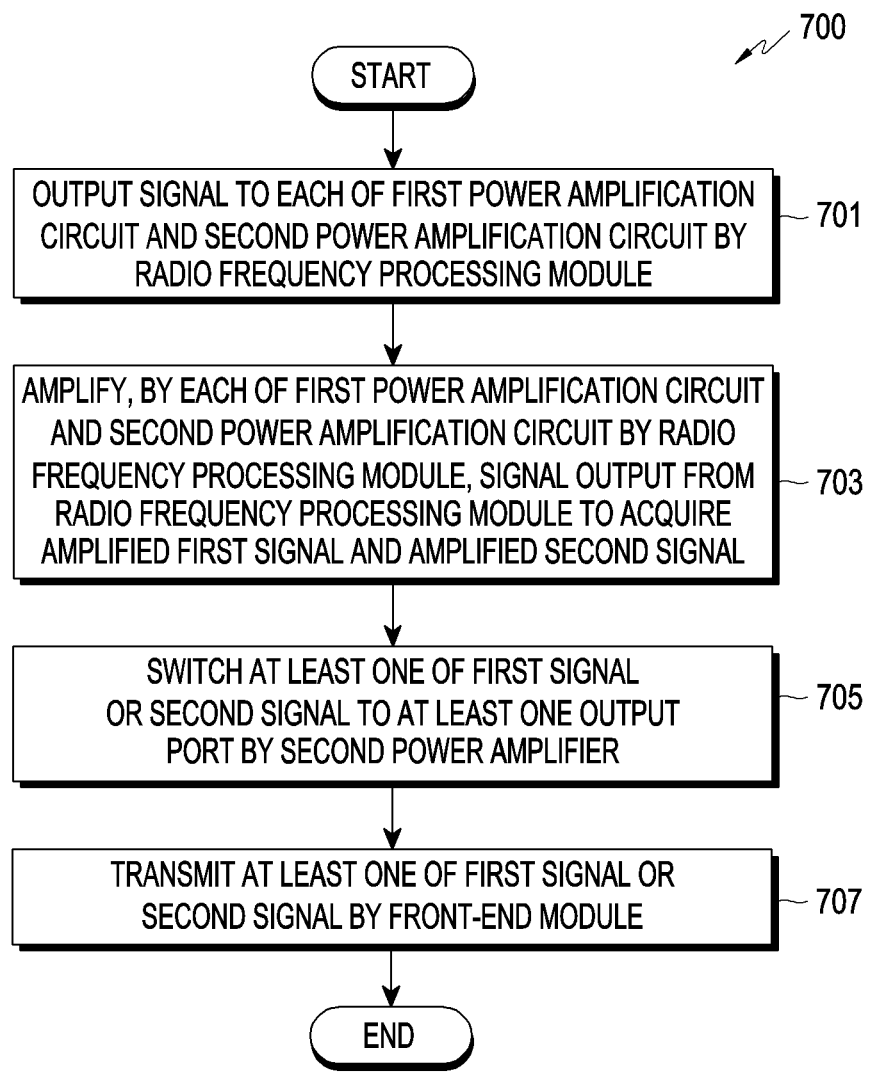
FIG. 7 is a flowchart illustrating an example method of operating an electronic device according to an embodiment.

FIG. 7 is a flowchart illustrating an example method 700 of operating an electronic device according to an embodiment.

An electronic device (e.g., the electronic device 101 of FIGS. 1 and 2) according to an embodiment may perform a method 700 for wireless communication in a wireless communication module (e.g., the wireless communication module 192 of FIG. 1 and the wireless communication module 200 of FIG. 2) supporting a first communication scheme and a second communication scheme.

Referring to FIG. 7, in operation 701, the electronic device, by a processor (e.g., the processor 120 of FIG. 1), may perform control to output a signal to a first power amplification circuit (e.g., the first power amplification circuit 220 of FIG. 3) and a second power amplification circuit (e.g., the second power amplification circuit 230 of FIG. 3) through a radio processing module (e.g., the radio frequency processing module 210 of FIG. 2), based on a combination of frequency bands for the first communication scheme and the second communication scheme.

In operation 703, the electronic device, by a processor, may amplify signals output from the first power amplification circuit and the second power amplification circuit to the radio frequency processing module. Each of the first power amplification circuit and the second power amplification circuit may include at least one power amplifier. The first power amplification circuit may support the first communication scheme and the second communication scheme, and may output a first signal obtained by amplifying a signal of the first communication scheme and/or the second communication scheme to an input terminal of the second power amplification circuit. The processor may control the second power amplification circuit to acquire the first signal from the first power amplification circuit and acquire a second signal obtained by amplifying a signal output from the radio frequency processing module.

In operation 705, the electronic device, by the processor, may control the second power amplification circuit to switch at least one of the first signal or the second signal to at least one output port connected to the front-end module, based on the first frequency band of the first signal and the second frequency band of the second signal. The second power amplification circuit may support the first communication scheme and the second communication scheme, and may include a switch module (e.g., the switch module 233 of FIG. 3). The second power amplification circuit may perform switching operation to simultaneously or selectively output the first signal of the first communication scheme and the second signal of the second communication scheme.

In operation 707, the electronic device, by the processor, may control the front-end module to transmit at least one of the first signal or the second signal to at least one of the first frequency band or the second frequency band through the antenna.

In operation 705 above, when the first frequency band is different from the second frequency band, the processor may control the second power amplification circuit to switch the first signal to a first output port among at least one output port so as to transmit the first signal in the first frequency band, and to switch the second signal to a second output port among the least one output port so as to transmit the second signal in the second frequency band. When it is identified that the first frequency band and the second frequency band are designated as the same frequency band, the processor may control the second power amplification circuit to switch one of the first signal and the second signal to one of the at least one output port.

In operation 705, as shown in FIGS. 4A and 4B, the second power amplification circuit of the wireless communication module may receive a third signal of the first communication scheme from the radio frequency processing module through the first power amplification circuit, based on a combination of frequency bands, and may receive a fourth signal of the second communication scheme from the radio frequency processing module, based on a combination of frequency bands. The second power amplification circuit may switch at least one of the third signal or the fourth signal to at least one output port connected to a front-end module, based on a third frequency band of the third signal and a fourth frequency band of the fourth signal. When the third frequency band and the fourth frequency band are designated as different frequency bands, the second power amplification circuit may switch the third signal to a third output port among the at least one output port so as to transmit the third signal in the third frequency band of the third signal, and switch the fourth signal to a fourth output port among the at least one output port so as to transmit the fourth signal in the fourth frequency band of the fourth signal. When the second power amplification circuit identifies that the third frequency band and the fourth frequency band are designated as the same frequency band, one of the third signal and the fourth signal may be switched to one of the at least one output port, by the second power amplification circuit.

According to an embodiment, a method for wireless communication in an electronic device (e.g., the electronic device 101 of FIGS. 1 and 2) including a wireless communication module comprising communication circuitry (e.g., the wireless communication module 192 of FIG. 1 and the wireless communication module 200 of FIG. 2) may include: amplifying a signal output from a radio frequency processing module comprising radio frequency circuitry (e.g., the radio frequency processing module 210 of FIGS. 2, 4A, 4B, 5, and 6) of the wireless communication module, by a first power amplification circuit (e.g., the first power amplification circuit 220 of FIGS. 2, 3, 4A, 4B, 5, and 6) of the wireless communication module, based on a combination of frequency bands for a first communication scheme and a second communication scheme, acquiring, as a first signal, an amplification signal output from the first power amplification circuit, and acquiring a second signal by amplifying a signal output from the radio frequency processing module, based on the combination of the frequency bands, by a second power amplification circuit (e.g., the second power amplification circuit 230 of FIGS. 2, 3, 4A, 4B, 5, and 6) of the wireless communication module, and switching at least one of the first signal or the second signal to at least one output port connected to a front-end module (e.g., the front-end module 240 of FIGS. 2, 3, 4A, 4B, 5, and 6) of the wireless communication module, by the second power amplification circuit, based on a first frequency band of the first signal and a second frequency band of the second signal.

According to an embodiment, the method may further include transmitting at least one of the first signal or the second signal input through the at least one output port, through the antenna by the front-end module. The first communication scheme may correspond to a 5G communication scheme, and the second communication scheme may correspond to a 4G communication scheme.

According to an embodiment, the method may further include amplifying the first signal to be transmitted in the first frequency band of the first communication scheme, by the first power amplification circuit; and outputting the first signal upon an input of the second power amplification circuit.

According to an embodiment, the switching of at least one of the first signal or the second signal to the at least one of the output port connected to the front-end module of the wireless communication module may include switching, by the second power amplification circuit, the first signal to a first output port among the least one output port to transmit the first signal, and switching the second signal to a second output port among the at least one output port to transmit the second signal. The first frequency band may be different from the second frequency band.

According to an embodiment, the switching of at least one of the first signal or the second signal to the at least one output port connected to the front-end module of the wireless communication module may include switching one of the first signal or the second signal to one of the at least one output port based on the first frequency band being identical to the second frequency band.

According to an embodiment, the method may further include switching the first signal to a first output port among output ports of the front-end module connected to the antenna, and switching the second signal to a second output port among the output ports of the front-end module, by a switch module comprising a switch (e.g., the first switch module 601 and the switch module 603 of FIG. 6) of the front-end module based on the first signal being input from at least one of the first power amplification circuit or the second power amplification circuit and the second signal being input from the second power amplification circuit, wherein the first frequency band is different from the second frequency band.

According to an embodiment, the method may further include switching one of the first signal or the second signal to one of the output ports of the front-end module, by a switch module (e.g., the first switch module 601 and the second switch module 603 of FIG. 6) of the front-end module based on the first signal being input from at least one of the first power amplification circuit or the second power amplification circuit and the second signal being input from the second power amplification circuit, wherein the first frequency band may be identical to the second frequency band.

According to an embodiment, in a non-transitory storage medium storing a program, the program comprising executable instructions which, when executed by a processor of an electronic device, causes, the processor to: receive, by a second power amplification circuit of a wireless communication module comprising wireless communication circuitry, a first signal from a radio frequency processing module comprising radio frequency circuitry of the wireless communication module through a first power amplification circuit, based on a combination of frequency bands for a first communication scheme and a second communication scheme, receive a second signal from the radio frequency processing module by the second power amplification circuit, based on the combination of the frequency bands, and switch, by the second power amplification circuit, at least one of the first signal or the second signal to at least one output port connected to a front-end module of the wireless communication module, based on a first frequency band of the first signal and a second frequency band of the second signal.

The various example embodiments disclosed herein are provided to describe technical details of the disclosure and to aid in understanding of the disclosure, and are not intended to limit the scope of embodiments of the disclosure. Therefore, it should be understood that all modifications and changes or various other embodiments based on the technical idea of the disclosure fall within the scope of the disclosure.

The electronic device according to various embodiments disclosed herein may be one of various types of electronic devices. The electronic device may include, for example, a portable communication device (e.g., a smartphone), a computer device, a portable multimedia device, a portable medical device, a camera, a wearable device, a home appliance, or the like. The electronic device according to an embodiment of the disclosure is not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure including the appended claims and their equivalents. It will also be understood that any of the embodiment(s) described herein may be used in conjunction with any other embodiment(s) described herein.

What is claimed is:

1. An electronic device comprising:
a radio frequency processing module comprising radio frequency circuitry;
a first power amplification circuit connected to the radio frequency processing module;
a second power amplification circuit connected to the radio frequency processing module and the first power amplification circuit; and
a front-end module comprising circuitry connected to the second power amplification circuit and an antenna and configured to transmit a signal,
wherein the second power amplification circuit is configured to acquire, from the first power amplification circuit, a first signal obtained by amplifying a signal output from the radio frequency processing module and acquire a second signal by amplifying a signal output from the radio frequency processing module, based on a combination of frequency bands for a first communication scheme and a second communication scheme, and to switch at least one of the first signal or the second signal to at least one output port connected to the front-end module, based on a first frequency band of the first signal and a second frequency band of the second signal.

2. The electronic device of claim 1, further comprising a processor electrically connected to the radio frequency processing module and configured to control operations of the first power amplification circuit and the second power amplification circuit, wherein the front-end module is configured to transmit at least one of the first signal or the second signal input through the at least one output port, through the antenna, wherein the first communication scheme corresponds to a 5G communication scheme, and wherein the second communication scheme corresponds to a 4G communication scheme.

3. The electronic device of claim 1, wherein the first power amplification circuit comprises at least one power amplifier configured to amplify at least one signal input from the radio frequency processing module, and is configured to output at least one signal output from the at least one power amplifier, to the second power amplification circuit through at least one output port connected to the second power amplification circuit, wherein the at least one amplified signal comprises the first signal of the first communication scheme.

4. The electronic device of claim 1, wherein the second power amplification circuit comprises:

at least one power amplifier configured to amplify at least one signal input from the radio frequency processing module; and a switch module comprising at least one switch configured to switch at least one signal amplified from the at least one power amplifier and at least one signal input from the first power amplification circuit, to the at least one output port connected to the front-end module.

5. The electronic device of claim 4, wherein the switch module comprises at least one switch connected to at least one output port of the first power amplification circuit and at least one switch connected to at least one amplifier of the second power amplification circuit, and wherein the at least one amplified signal comprises the second signal of the second communication scheme.

6. The electronic device of claim 4, wherein the switch module is configured to switch the first signal to a first output port among the least one output port to transmit the first signal, and to switch the second signal to a second output port among the at least one output port to transmit the second signal, and wherein the first frequency band is different from the second frequency band.

7. The electronic device of claim 4, wherein the switch module is configured to switch one of the first signal or the second signal to one of the at least one output port based on the first frequency band being identical to the second frequency band.

8. The electronic device of claim 1, wherein the front-end module comprises a switch module comprising at least one switch configured to switch at least one signal output from at least one of the first power amplification circuit or the second power amplification circuit, wherein based on the first signal is input from at least one of the first power amplification circuit or the second power amplification circuit and the second signal being input from the second power amplification circuit, the switch module is configured to switch the first signal to a first output port among output ports of the front-end module connected to the antenna, and to switch the second signal to a second output port among the output ports of the front-end module, and wherein the first frequency band is different from the second frequency band.

9. The electronic device of claim 8, wherein the switch module is configured to switch one of the first signal or the second signal to one of the output ports of the front-end module based on the first signal being input from at least one of the first power amplification circuit or the second power amplification circuit and the second signal being input from the second power amplification circuit, and wherein the first frequency band is identical to the second frequency band.

10. A method for wireless communication in an electronic device comprising a wireless communication module, the method comprising:

amplifying a signal output from a radio frequency processing module of the wireless communication module, by a first power amplification circuit of the wireless communication module, based on a combination of frequency bands for a first communication scheme and a second communication scheme;

acquiring, as a first signal, an amplification signal output from the first power amplification circuit, and acquiring a second signal by amplifying a signal output from the radio frequency processing module, based on the combination of the frequency bands, by a second power amplification circuit of the wireless communication module; and switching at least one of the first signal or the second signal to at least one output port connected to a front-end module of the wireless communication module, by the second power amplification circuit, based on a first frequency band of the first signal and a second frequency band of the second signal.

11. The method of claim 10, further comprising:

amplifying the first signal to be transmitted in the first frequency band of the first communication scheme, by the first power amplification circuit;

outputting the first signal upon an input of the second power amplification circuit; and transmitting at least one of the first signal or the second signal input through the at least one output port, through the antenna by the front-end module, wherein the first communication scheme corresponds to a 5G communication scheme, and wherein the second communication scheme corresponds to a 4G communication scheme.

12. The method of claim 10, wherein the switching of at least one of the first signal or the second signal to the at least one of the output port connected to the front-end module of the wireless communication module comprises:

switching, by the second power amplification circuit, the first signal to a first output port among the least one output port to transmit the first signal; and switching the second signal to a second output port among the at least one output port to transmit the second signal, and wherein the first frequency band is different from the second frequency band.

13. The method of claim 10, wherein the switching of at least one of the first signal or the second signal to the at least one output port connected to the front-end module of the wireless communication module comprises switching one of the first signal or the second signal to one of the at least one output port based on the first frequency band being identical to the second frequency band.

14. The method of claim 10, further comprising switching the first signal to a first output port among output ports of the front-end module connected to the antenna, and switching the second signal to a second output port among the output ports of the front-end module, by a switch module of the front-end module based on the first signal being input from at least one of the first power amplification circuit or the second power amplification circuit and the second signal being input from the second power amplification circuit,
wherein the first frequency band is different from the second frequency band.

15. The method of claim 10, further comprising switching one of the first signal or the second signal to one of the output ports of the front-end module, by a switch module of the front-end module based on the first signal being input from at least one of the first power amplification circuit or the second power amplification circuit and the second signal being input from the second power amplification circuit,
wherein the first frequency band is identical to the second frequency band.

* * * * *